US011889616B2

(12) United States Patent
Toyonaga et al.

(10) Patent No.: US 11,889,616 B2
(45) Date of Patent: Jan. 30, 2024

(54) CIRCUIT BOARD

(71) Applicant: Mitsubishi Electric Corporation, Tokyo (JP)

(72) Inventors: Masatoshi Toyonaga, Tokyo (JP); Satoru Ishizaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/267,115

(22) PCT Filed: Mar. 9, 2021

(86) PCT No.: PCT/JP2021/009369
§ 371 (c)(1),
(2) Date: Jun. 14, 2023

(87) PCT Pub. No.: WO2022/190220
PCT Pub. Date: Sep. 15, 2022

(65) Prior Publication Data
US 2023/0403785 A1    Dec. 14, 2023

(51) Int. Cl.
*H05K 1/02* (2006.01)

(52) U.S. Cl.
CPC ......... *H05K 1/0231* (2013.01); *H05K 1/0225* (2013.01); *H05K 1/0233* (2013.01);
(Continued)

(58) Field of Classification Search
CPC .. H05K 1/0231; H05K 1/0225; H05K 1/0233; H05K 2201/10015; H05K 2201/1006
See application file for complete search history.

(56) References Cited

U.S. PATENT DOCUMENTS 11,201,602 B1 * 12/2021 Oran ................... H03J 3/20
2002/0015293 A1 * 2/2002 Akiba ................. H01L 25/16
257/E23.114
(Continued)

FOREIGN PATENT DOCUMENTS

JP    2003-282348 A    10/2003
JP    2006-041273 A     2/2006
(Continued)

OTHER PUBLICATIONS

International Search Report and Written Opinion dated May 25, 2021, received for PCT Application PCT/JP2021/009369, filed on Mar. 9, 2021, 8 pages including English Translation.
(Continued)

*Primary Examiner* — Hoa C Nguyen
(74) *Attorney, Agent, or Firm* — XSENSUS LLP

(57) ABSTRACT

In a circuit board (700A), a first capacitor (410) extends from a wiring pattern (110) to a region located on one side of the wiring pattern (110) in the width direction. A second capacitor (420) extends from the wiring pattern (110) to a region located on the other side of the wiring pattern (110) in the width direction. With a semiconductor device (300) mounted on the circuit board (700A), a power supply terminal (320) is electrically connected to the wiring pattern (110). The semiconductor device (300), the wiring pattern (110), the first capacitor (410), a first interlayer joint (510), a ground plane (210), and a third interlayer joint (530) constitute a first closed circuit. The semiconductor device (300), the wiring pattern (110), the second capacitor (420), a second interlayer joint (520), the ground plane (210), and the third interlayer joint (530) constitute a second closed circuit.

9 Claims, 10 Drawing Sheets

(52) U.S. Cl.
CPC ............... *H05K 2201/1006* (2013.01); *H05K 2201/10015* (2013.01)

(56) References Cited

U.S. PATENT DOCUMENTS

| | | | |
|---|---|---|---|
| 2004/0008470 A1 | 1/2004 | Azuma et al. | |
| 2005/0047457 A1* | 3/2005 | Shibuya | G11B 7/126 |
| | | | 372/38.03 |
| 2007/0279880 A1* | 12/2007 | Weir | H01L 23/66 |
| | | | 361/794 |
| 2008/0305579 A1* | 12/2008 | Lin | H01L 24/80 |
| | | | 438/114 |
| 2012/0098608 A1 | 4/2012 | Taya | |
| 2020/0162051 A1 | 5/2020 | Taniguchi et al. | |
| 2020/0260586 A1* | 8/2020 | Hong | H05K 1/165 |
| 2021/0111660 A1* | 4/2021 | Matsuda | H02M 1/348 |
| 2023/0075019 A1* | 3/2023 | Kabir | B82Y 10/00 |

FOREIGN PATENT DOCUMENTS

| | | |
|---|---|---|
| JP | 2010-098162 A | 4/2010 |
| JP | 2012-090098 A | 5/2012 |
| JP | 2012-213255 A | 11/2012 |
| JP | 2017-017470 A | 1/2017 |
| JP | 2020-088888 A | 6/2020 |

OTHER PUBLICATIONS

Decision to Grant dated Nov. 30, 2021, received for JP Application 2021-557855, 5 pages including English Translation.

* cited by examiner

CIRCUIT BOARD

CROSS-REFERENCE TO RELATED APPLICATION

The present application is based on PCT filing PCT/JP2021/009369, filed Mar. 9, 2021, the entire contents of which are incorporated herein by reference.

TECHNICAL FIELD

The present disclosure relates to a circuit board.

BACKGROUND ART

Circuit boards have been known that include wiring members to feed electric power to a semiconductor device, ground members to provide a reference potential to the semiconductor device, and bypass capacitors to electrically short the wiring members to the ground member, like that disclosed in Patent Literature 1.

Patent Literature 1 proposes a structure of a noise filter including a pair of capacitors serving as the bypass capacitors in order to reduce high-frequency noise current generated in the semiconductor device. Specifically, the noise filter disclosed in Patent Literature 1 includes a main wiring pattern on the surface of a printed circuit board, a pair of branch wiring patterns branching from the main wiring pattern and disposed on both sides of the main wiring pattern, and a pair of grounding wires that face one terminals of the respective branch wiring patterns. The noise filter is provided with capacitors each disposed across the one terminal of the branch wiring pattern and one terminal of the grounding wire.

CITATION LIST

Patent Literature

Patent Literature 1: Unexamined Japanese Patent Application Publication No. 2017-017470

SUMMARY OF INVENTION

Technical Problem

Patent Literature 1 discloses reducing the noise current as conduction noise transmitted in the main wiring pattern, but does not disclose reducing electromagnetic waves (hereinafter referred to as "radiation noise") as noise radiated in the space.

In a circuit board including a closed circuit, the closed circuit unfortunately induces a magnetic field, which can be a source of radiation noise. The radiation noise propagates in the space in the direction extending through the closed circuit, and can cause electromagnetic interference (EMI) that brings about adverse effects on operations of electronic equipment disposed around the circuit board. Required is a configuration for reducing generation of radiation noise.

An objective of the present disclosure is to provide a circuit board that can suppress generation of radiation noise.

Solution to Problem

In order to achieve the above objective, a circuit board according to an aspect of the present disclosure includes a stack of a first conductive layer and a second conductive layer each having electrical conductivity provided with an insulating layer having an electrical insulating property therebetween, and is provided with a semiconductor device thereon that includes a reference terminal to provide a reference potential and a non-reference terminal to output a signal. The circuit board includes: a wiring member included in the first conductive layer; a first capacitor and a second capacitor, each of which has one terminal connected to the wiring member; a reference member included in the second conductive layer; a first interlayer joint to electrically connect the reference member to another terminal of the first capacitor; a second interlayer joint to electrically connect the reference member to another terminal of the second capacitor; and a third interlayer joint to electrically connect the reference member to the reference terminal, with the semiconductor device is mounted on the circuit board. The first capacitor extends from the wiring member to a region located on one side of the wiring member in the width direction, and the second capacitor extends from the wiring member to a region located on another side of the wiring member in the width direction. With the semiconductor device mounted on the circuit board, the non-reference terminal is electrically connected to the wiring member; the semiconductor device, the wiring member, the first capacitor, the first interlayer joint, the reference member, and the third interlayer joint constitute a first closed circuit; and the semiconductor device, the wiring member, the second capacitor, the second interlayer joint, the reference member, and the third interlayer joint constitute a second closed circuit.

Advantageous Effects of Invention

The above-described structure achieves the first closed circuit and the second closed circuit, with the semiconductor device mounted on the circuit board. The induced magnetic field (hereinafter referred to as "first induced magnetic field") generated in the first closed circuit and the induced magnetic field (hereinafter referred to as "second induced magnetic field") generated in the second closed circuit have mutually opposite directions in a plane parallel to the first conductive layer, so that the first induced magnetic field and the second induced magnetic field offset or diminish each other.

The first induced magnetic field and the second induced magnetic field have mutually opposite directions also in the thickness direction of the circuit board in a sectional view of the first conductive layer taken along the direction of extension of the first capacitor and the second capacitor, so that the first induced magnetic field and the second induced magnetic field offset or diminish each other.

The above-described structure can narrow the respective areas surrounded by the first closed circuit and the second closed circuit when viewed in the width direction of the wiring member, in comparison to a structure in which the first capacitor and the second capacitor extend in the lengthwise direction of the wiring member. The structure can thus achieve a lower intensity of radiation noise in the width direction of the wiring member than an existing structure.

The structure can suppress generation of radiation noise as described above.

DESCRIPTION OF EMBODIMENTS

Figure 1:
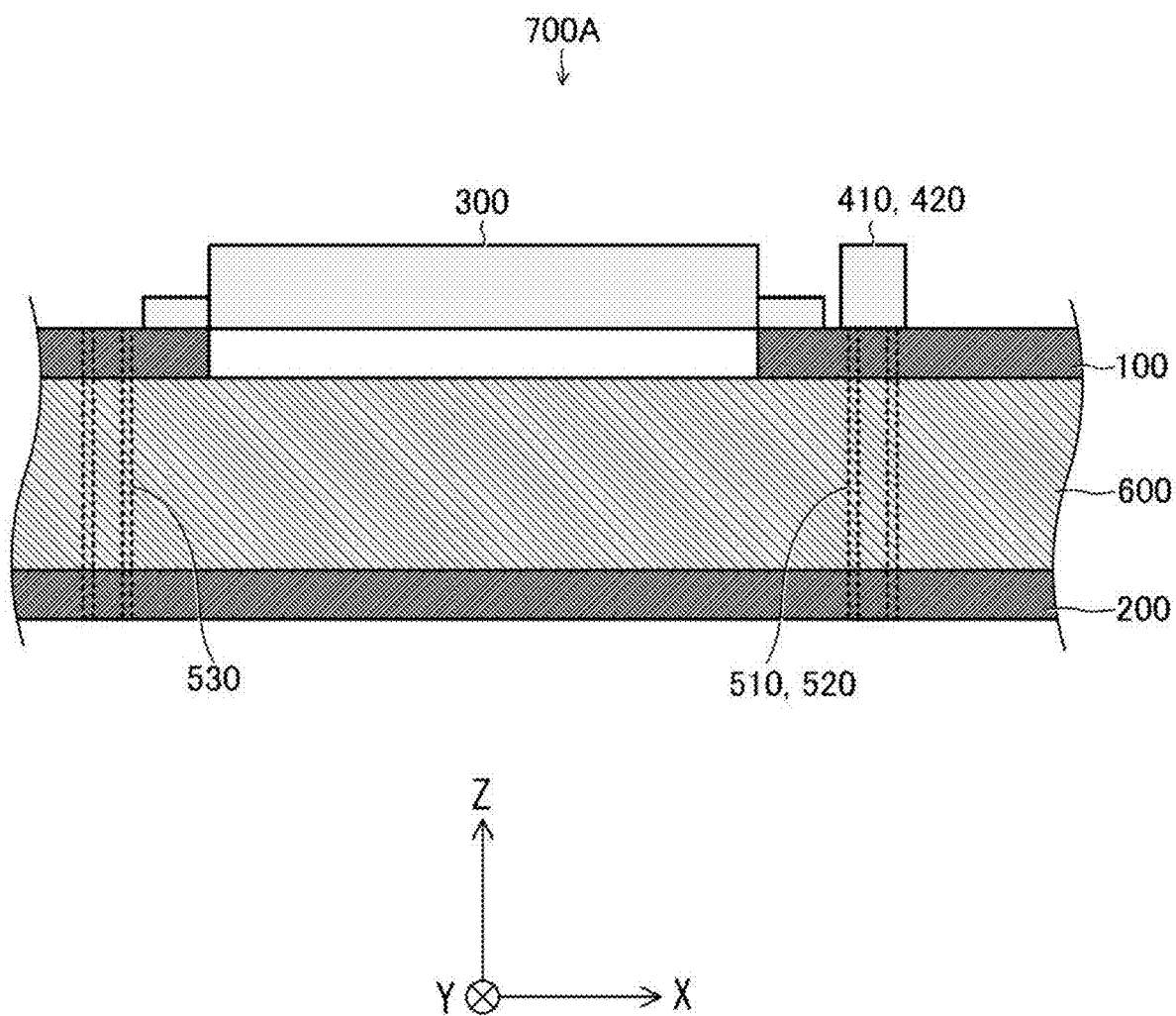
FIG. 1 is a sectional view of a major portion of a circuit board according to Embodiment 1.

A circuit board according to Embodiments 1 to 7 is described below with reference to the accompanying drawings. In the drawings, the components identical or corresponding to each other are provided with the same reference symbol. The following description of Embodiments 1 to 7 assumes a circuit board on which a semiconductor device is mounted.

Embodiment 1

As illustrated in FIG. 1, a circuit board 700A according to the embodiment has a structure in which a first conductive layer 100 and a second conductive layer 200 having electrical conductivity are stacked in the thickness direction while holding an insulating layer 600 having electrical insulating properties therebetween. The first conductive layer 100 is provided with a semiconductor device 300, a first capacitor 410, and a second capacitor 420 thereon.

Figure 2:
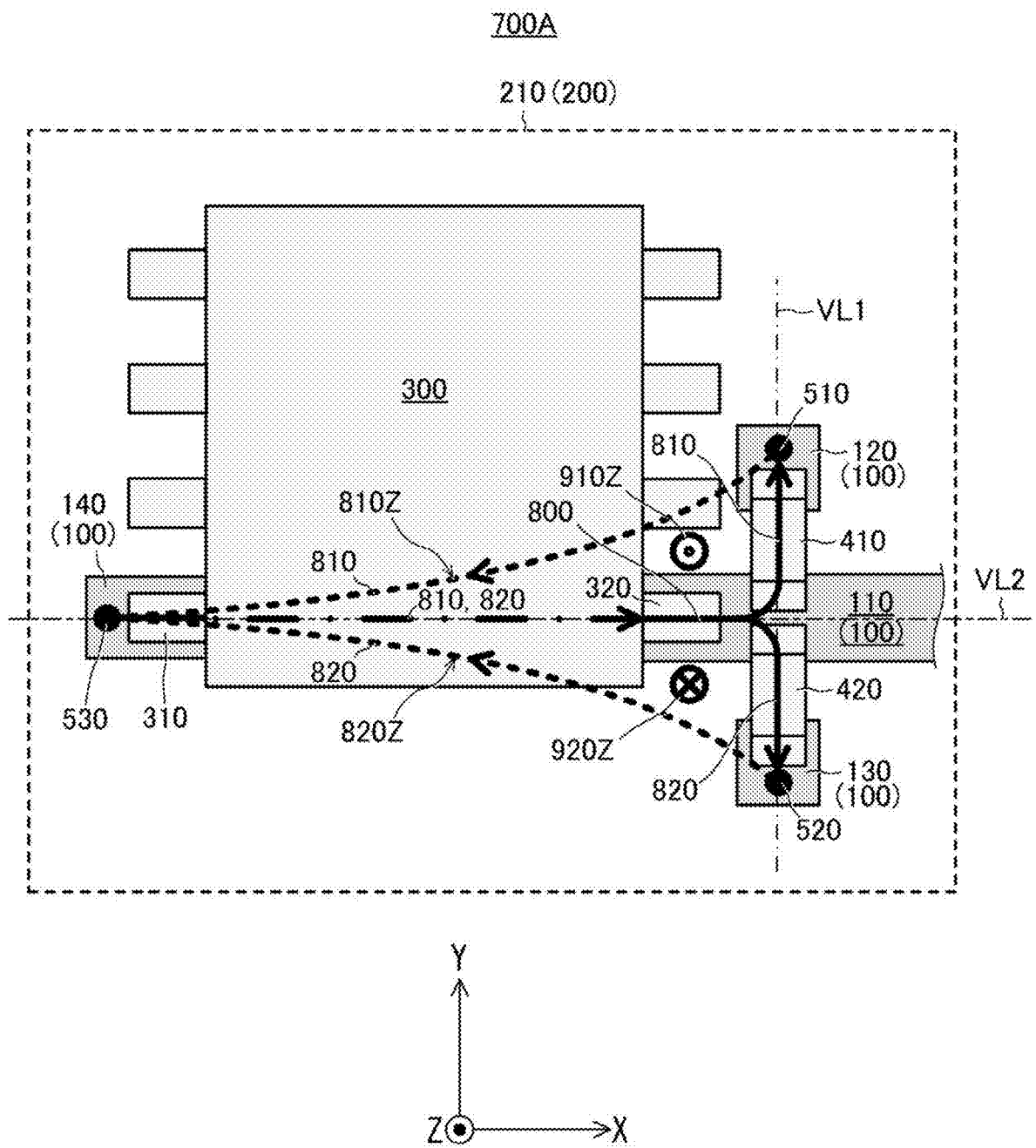
FIG. 2 is a plan view of the major portion of the circuit board according to Embodiment 1.

As illustrated in FIG. 2, the semiconductor device 300 includes a ground terminal 310 to provide a reference potential, and a power supply terminal 320 to output signals from the semiconductor device 300. The ground terminal 310 is an example of a reference terminal according to the present disclosure. The power supply terminal 320 is an example of a non-reference terminal according to the present disclosure. In the embodiment, the ground terminal 310 and the power supply terminal 320 are exactly opposed to each other on both sides of the body of the semiconductor device 300.

The first conductive layer 100 includes a wiring pattern 110 electrically connected to the power supply terminal 320 of the semiconductor device 300, and a ground pad 140 electrically connected to the ground terminal 310 of the semiconductor device 300. The wiring pattern 110 is an example of a wiring member according to the present disclosure. The first conductive layer 100 also includes a first pad 120 provided with a terminal of the first capacitor 410 thereon, and a second pad 130 provided with a terminal of the second capacitor 420 thereon.

In order to simplify the following description, the embodiment defines a right-handed XYZ orthogonal coordinate system, in which the Z axis is parallel to the thickness direction of the circuit board 700A, and the positive X-axis direction corresponds to the direction from the ground terminal 310 of the semiconductor device 300 to the power supply terminal 320 in a plan view of the first conductive layer 100.

The wiring pattern 110 extends in the positive X-axis direction from one end on which the power supply terminal 320 of the semiconductor device 300 is disposed. That is, the wiring pattern 110 extends in the direction in which the power supply terminal 320 extends from the body of the semiconductor device 300, in the plan view of the first conductive layer 100.

The wiring pattern 110, of which the one end is connected to the power supply terminal 320, has the other end connected to a power supply circuit, which is not illustrated. The power supply circuit feeds power supply voltage via the wiring pattern 110 to the semiconductor device 300. The power supply circuit may be excluded in the case of the semiconductor device 300 serving as a power supply.

FIG. 2 does not illustrate components connected to the terminals of the semiconductor device 300 other than the ground terminal 310 and the power supply terminal 320, among the components of the first conductive layer 100.

Each of the first capacitor 410 and the second capacitor 420 is electrically connected to the wiring pattern 110 such that one terminal is disposed on the wiring pattern 110.

The specification assumes that the "one terminal" of a capacitor indicates a terminal connected to one of the pair of electrodes included in the capacitor, and the "other terminal" of the capacitor indicates a terminal connected to the other of the pair of electrodes.

The first capacitor 410, of which the one terminal is disposed on the wiring pattern 110, extends from the wiring pattern 110 to a region located on one side of the wiring pattern 110 in the width direction. The second capacitor 420, of which the one terminal is disposed on the wiring pattern 110, extends from the wiring pattern 110 to a region located on the other side of the wiring pattern 110 in the width direction.

The "width direction of the wiring pattern 110" indicates the width direction of the wiring pattern 110 at the position of connection with the one terminal of the first capacitor 410 and the one terminal of the second capacitor 420, that is, the Y-axis direction in the embodiment.

Specifically, the first capacitor 410 extends from the wiring pattern 110 to a region located on a positive Y-axis side of the wiring pattern 110. The second capacitor 420 extends from the wiring pattern 110 to a region located on a negative Y-axis side of the wiring pattern 110.

More specifically, the first capacitor 410 and the second capacitor 420 extend from the wiring pattern 110 in mutually opposite directions such that the one terminals of the respective capacitors face each other in a first virtual straight line VL1 extending in the Y-axis direction perpendicularly to the wiring pattern 110, in a plan view of the first conductive layer 100 (hereinafter simply referred to as "plan view").

The other terminal of the first capacitor 410 is disposed on the first pad 120, which is a component of the first conductive layer 100, and electrically connected to the first pad 120. The other terminal of the second capacitor 420 is disposed on the second pad 130, which is another component of the first conductive layer 100, and electrically connected to the second pad 130.

No component of the first conductive layer 100 exists between the wiring pattern 110 and the first pad 120, or between the wiring pattern 110 and the second pad 130. That is, the wiring pattern 110 and the first pad 120 are connected to each other via only the first capacitor 410, while the wiring pattern 110 and the second pad 130 are connected to each other via only the second capacitor 420.

As illustrated with the thin dashed line in FIG. 2, the second conductive layer 200 includes a ground plane 210 to provide a reference potential to the semiconductor device 300. The ground plane 210 is an example of a reference member according to the present disclosure.

The ground plane 210 is distributed in a plane shape. The ground plane 210 encompasses a projected area, which is depicted by vertically projecting the first capacitor 410, the second capacitor 420, the first pad 120, the second pad 130, the ground pad 140, and the semiconductor device 300 on the second conductive layer 200.

The circuit board 700A also includes a first interlayer joint 510, a second interlayer joint 520, and a third interlayer joint 530 each of which extends in the Z-axis direction.

The first interlayer joint 510 electrically connects the ground plane 210 to the first pad 120 connected to the other terminal of the first capacitor 410. That is, the first interlayer joint 510 electrically connects the ground plane 210 to the other terminal of the first capacitor 410.

The second interlayer joint 520 electrically connects the ground plane 210 to the second pad 130 connected to the other terminal of the second capacitor 420. That is, the second interlayer joint 520 electrically connects the ground plane 210 to the other terminal of the second capacitor 420.

The third interlayer joint 530 electrically connects the ground plane 210 to the ground pad 140 connected to the ground terminal 310. That is, the third interlayer joint 530 electrically connects the ground plane 210 to the ground terminal 310.

The first interlayer joint 510, the second interlayer joint 520, and the third interlayer joint 530 are also illustrated in FIG. 1. Each of the first interlayer joint 510, the second interlayer joint 520, and the third interlayer joint 530 is fabricated by applying metal plating to the inner surface of a via hole leading from the first conductive layer 100 to the second conductive layer 200.

Each of the first interlayer joint 510, the second interlayer joint 520, and the third interlayer joint 530 has an end in the negative Z-axis direction encompassed in the region of the ground plane 210.

As illustrated in FIG. 2, the first interlayer joint 510 has an end in the positive Z-axis direction encompassed in the region of the first pad 120. The second interlayer joint 520 has an end in the positive Z-axis direction encompassed in the region of the second pad 130. The third interlayer joint 530 has an end in the positive Z-axis direction encompassed in the region of the ground pad 140.

In the above-described circuit board 700A, the semiconductor device 300 is fed with power supply voltage via the wiring pattern 110 and thereby operates. The operation of the semiconductor device 300 induces generation of noise current 800, which is high-frequency current, inside the semiconductor device 300. That is, the semiconductor device 300 is an active element serving as an origin of the noise current 800. The noise current 800 has a frequency of 100 kHz or higher, more specifically, 1 MHz or higher.

The noise current 800 generated in the semiconductor device 300 flows through the power supply terminal 320 into the wiring pattern 110. A part of the noise current 800 flowing in the wiring pattern 110 branches into first noise current 810 flowing in the first capacitor 410 and second noise current 820 flowing in the second capacitor 420.

The first noise current 810 flows through the first capacitor 410, the first pad 120, and the first interlayer joint 510, into the ground plane 210. The first noise current 810 then flows in the ground plane 210 to the third interlayer joint 530.

FIG. 2 illustrates the first noise current 810 flowing in the ground plane 210 with a thick dashed line. The first noise current 810 flows from the first interlayer joint 510 to the third interlayer joint 530 within the region of the ground plane 210 along the path defining a smooth curve and providing the minimum impedance.

This path is located closer to the projected virtual straight line, which is depicted by projecting a second virtual straight line VL2 extending in the lengthwise direction of the wiring pattern 110 as illustrated in FIG. 2 on the ground plane 210, than the imaginary line leading from the connection of the first interlayer joint 510 with the ground plane 210 to the connection of the third interlayer joint 530 with the ground plane 210, and is located closer to the connection of the first interlayer joint 510 with the ground plane 210 than the projected virtual straight line.

The first noise current 810, after flowing in the ground plane 210 as described above, flows through the third interlayer joint 530, the ground pad 140, and the ground terminal 310, and returns to the semiconductor device 300. The first noise current 810 returning to the semiconductor device 300 flows inside the semiconductor device 300, from the ground terminal 310 to the power supply terminal 320.

FIG. 2 illustrates the first noise current 810 flowing in the semiconductor device 300 with a thick dashed and single-dotted line. FIG. 2 assumes that the first noise current 810 flows inside the semiconductor device 300 in the positive X-axis direction.

As described above, the semiconductor device 300, the wiring pattern 110, the first capacitor 410, the first pad 120, the first interlayer joint 510, the ground plane 210, the third interlayer joint 530, and the ground pad 140 constitute a first closed circuit in which the first noise current 810 flows.

In contrast, the second noise current 820 flows through the second capacitor 420, the second pad 130, and the second interlayer joint 520, into the ground plane 210. The second noise current 820 then flows in the ground plane 210 to the third interlayer joint 530.

FIG. 2 illustrates the second noise current 820 flowing in the ground plane 210 with another thick dashed line. The second noise current 820 flows from the second interlayer joint 520 to the third interlayer joint 530 within the region of the ground plane 210 along the path defining a smooth curve and providing the minimum impedance.

This path is located closer to the projected virtual straight line, which is depicted by projecting the second virtual straight line VL2 extending in the lengthwise direction of the wiring pattern 110 as illustrated in FIG. 2 on the ground plane 210, than the imaginary line leading from the connection of the second interlayer joint 520 with the ground plane 210 to the connection of the third interlayer joint 530 with the ground plane 210, and is located closer to the connection of the second interlayer joint 520 with the ground plane 210 than the projected virtual straight line.

The second noise current 820, after flowing in the ground plane 210 as described above, flows through the third interlayer joint 530, the ground pad 140, and the ground terminal 310, and returns to the semiconductor device 300. The second noise current 820 returning to the semiconductor device 300 flows inside the semiconductor device 300 to the power supply terminal 320. The path of the second noise current 820 inside the semiconductor device 300 is identical to the path of the first noise current 810.

As described above, the semiconductor device 300, the wiring pattern 110, the second capacitor 420, the second pad 130, the second interlayer joint 520, the ground plane 210, the third interlayer joint 530, and the ground pad 140 constitute a second closed circuit in which the second noise current 820 flows.

The circuit board 700A according to the embodiment brings about effects described below.

The first capacitor 410 extends from the wiring pattern 110 to the first pad 120 located on a positive Y-axis side of the wiring pattern 110, as described above. The second capacitor 420 extends from the wiring pattern 110 to the second pad 130 located on a negative Y-axis side of the wiring pattern 110.

This structure provides the path of the first noise current 810 and the path of the second noise current 820 having mutually opposite circulations in the plan view. Specifically, while the first noise current 810 circulates in the first closed circuit in the counterclockwise direction in the plan view, the second noise current 820 circulates in the second closed circuit in the clockwise direction.

When the component of a first induced magnetic field, induced by the first noise current 810 in the first closed circuit, in the normal direction relative to the first conductive layer 100 is defined as a Z-axis component 910Z, and the component of a second induced magnetic field, induced by the second noise current 820 in the second closed circuit, in the normal direction is defined as a Z-axis component 920Z, then the Z-axis component 910Z and the Z-axis component 920Z offset or diminish each other.

Specifically, in the embodiment, the magnitude of the Z-axis component 910Z of the first induced magnetic field is equal to the magnitude of the Z-axis component 920Z of the second induced magnetic field. The Z-axis component 910Z of the first induced magnetic field is therefore offset by the Z-axis component 920Z of the second induced magnetic field. That is, the structure in the embodiment can eliminate generation of radiation noise in the Z-axis direction.

The embodiment particularly employs the features (A) to (D) listed below, in order to equalize the magnitude of the Z-axis component 910Z of the first induced magnetic field and the magnitude of the Z-axis component 920Z of the second induced magnetic field.

(A) The impedance of the first closed circuit against the noise current 800 is adjusted to be equal to the impedance of the second closed circuit. In particular, the electrostatic capacity of the first capacitor 410 is adjusted to be equal to the electrostatic capacity of the second capacitor 420.

(B) The first capacitor 410, the first interlayer joint 510, and the first pad 120 are disposed symmetrically to the second capacitor 420, the second interlayer joint 520, and the second pad 130, in the plan view about the second virtual straight line VL2 extending in the lengthwise direction of the wiring pattern 110. The "lengthwise direction of the wiring pattern 110" indicates the lengthwise direction of the wiring pattern 110 at the position of connection with the one terminal of the first capacitor 410 and the one terminal of the second capacitor 420, that is, the X-axis direction in the embodiment.

(C) The third interlayer joint 530, the ground terminal 310, and the power supply terminal 320 are aligned in the second virtual straight line VL2 in the plan view.

(D) The ground plane 210 is distributed in a plane shape encompassing the triangle region defined by the three vertices: the connection of the first interlayer joint 510 with the ground plane 210; the connection of the second interlayer joint 520 with the ground plane 210; and the connection of the third interlayer joint 530 with the ground plane 210.

The above-described feature (A) can equalize the magnitude of the first noise current 810 and the magnitude of the second noise current 820. The above-described features (B) to (D) can make the area surrounded by a first projected path 810Z viewed in the Z-axis direction, which is depicted by vertically projecting the path of circulation of the first noise current 810 on a virtual XY plane, equal to the area surrounded by a second projected path 820Z viewed in the Z-axis direction, which is depicted by vertically projecting the path of circulation of the second noise current 820 on the virtual XY plane.

These features can equalize the magnitude of the Z-axis component 910Z of the first induced magnetic field and the magnitude of the Z-axis component 920Z of the second induced magnetic field, so that the offset between the Z-axis component 910Z and the Z-axis component 920Z can eliminate generation of radiation noise in the Z-axis direction.

Figure 3:
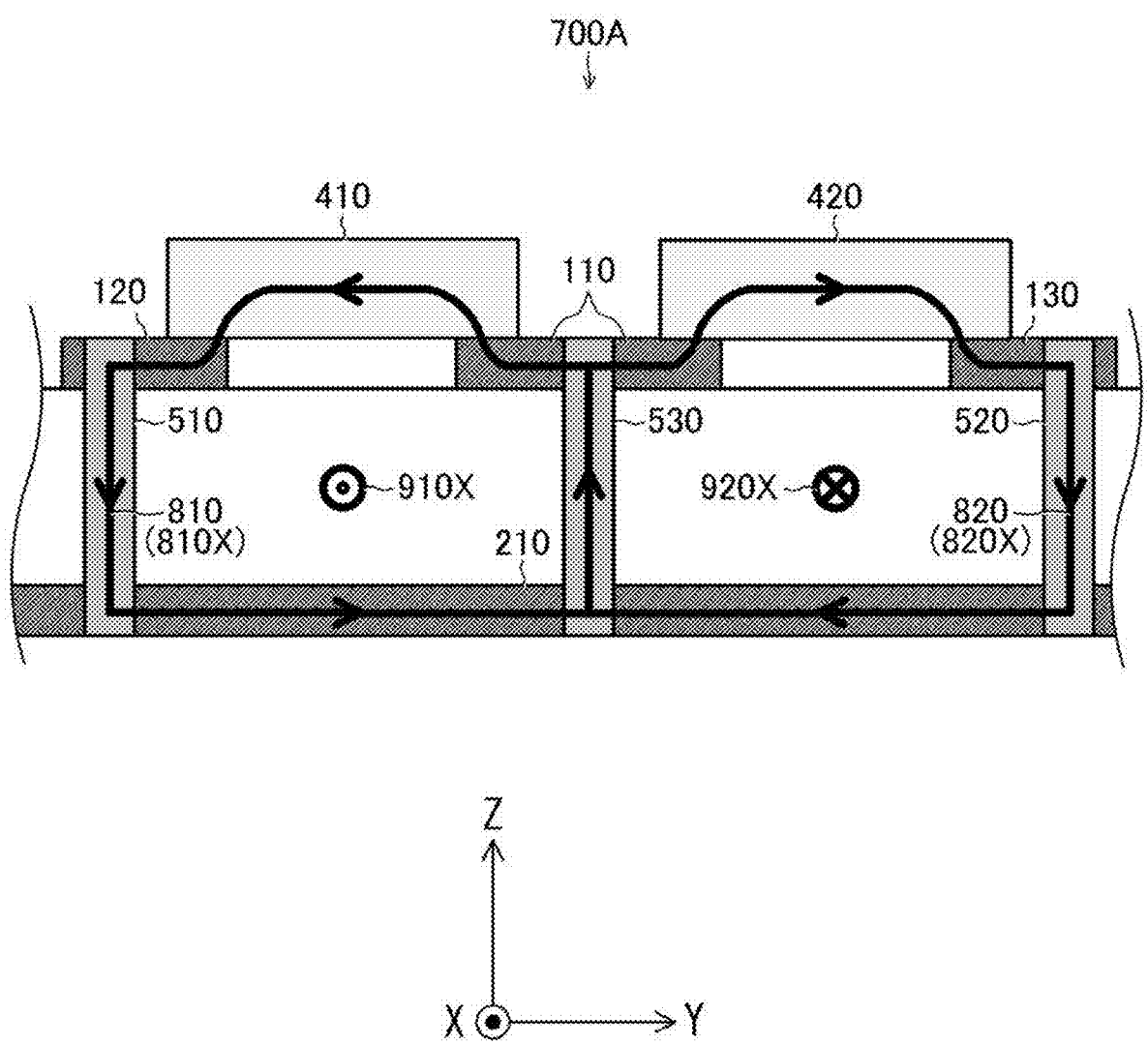
FIG. 3 is a conceptual diagram illustrating one side surface including paths of noise current according to Embodiment 1.

The following description is directed to an X-axis component 910X of the first induced magnetic field and an X-axis component 920X of the second induced magnetic field with reference to FIG. 3. FIG. 3 illustrates a side surface viewed in the X-axis direction including the path of circulation of the first noise current 810 and the path of circulation of the second noise current 820. FIG. 3 does not illustrate the insulating layer 600 illustrated in FIG. 1 because the insulating layer 600 is a dielectric body through which radiation noise passes.

The first capacitor 410 extends from the wiring pattern 110 to the first pad 120 located on a positive Y-axis side of the wiring pattern 110, as described above. The second capacitor 420 extends from the wiring pattern 110 to the second pad 130 located on a negative Y-axis side of the wiring pattern 110.

Accordingly, the path of the first noise current 810 and the path of the second noise current 820 have mutually opposite circulations also when viewed in the X-axis direction. The X-axis component 910X of the first induced magnetic field and the X-axis component 920X of the second induced magnetic field therefore offset or diminish each other.

Specifically, the above-described features (B) to (D) can make the area surrounded by a first projected path 810X viewed in the X-axis direction, which is depicted by vertically projecting the path of circulation of the first noise current 810 on a virtual YZ plane, equal to the area surrounded by a second projected path 820X viewed in the X-axis direction, which is depicted by vertically projecting the path of circulation of the second noise current 820 on the virtual YZ plane. Furthermore, the above-described feature (A) can equalize the magnitude of the first noise current 810 and the magnitude of the second noise current 820.

These features can equalize the magnitude of the X-axis component 910X of the first induced magnetic field and the magnitude of the X-axis component 920X of the second induced magnetic field, so that the offset between the X-axis component 910X and the X-axis component 920X can eliminate generation of radiation noise in the X-axis direction.

Figure 4:
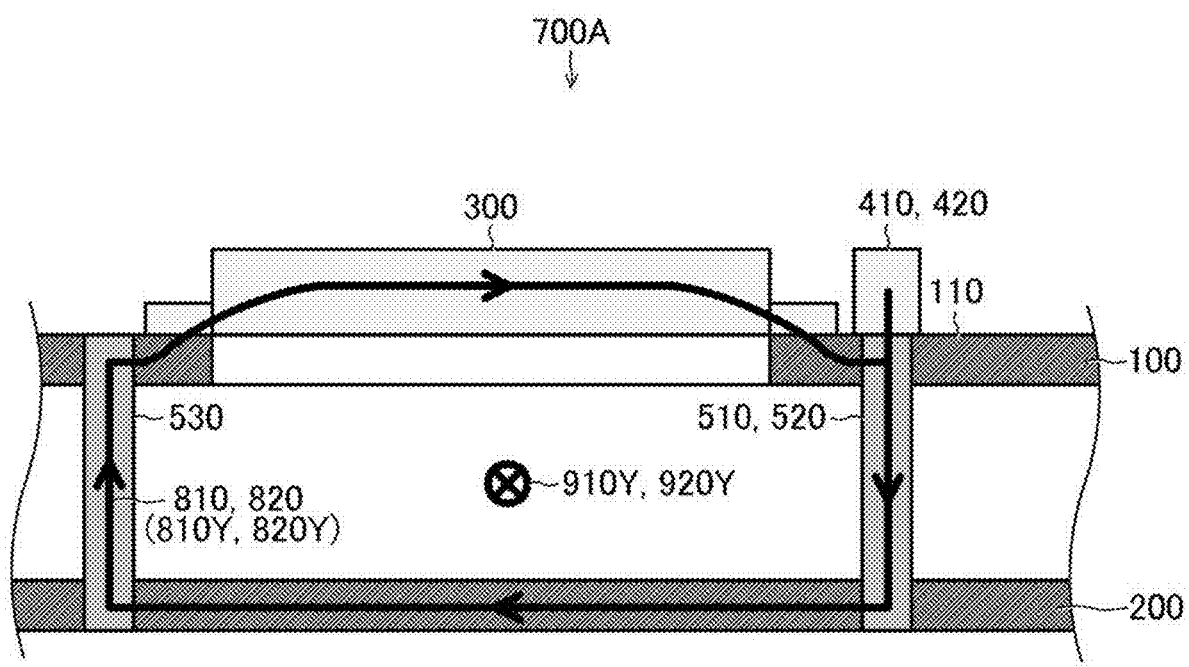
FIG. 4 is a conceptual diagram illustrating another side surface including the paths of noise current according to Embodiment 1.

The following description is directed to a Y-axis component 910Y of the first induced magnetic field and a Y-axis component 920Y of the second induced magnetic field with reference to FIG. 4. FIG. 4 illustrates a side surface viewed in the Y-axis direction including the path of circulation of the first noise current 810 and the path of circulation of the second noise current 820. FIG. 4 does not illustrate the insulating layer 600 illustrated in FIG. 1.

The first capacitor 410 and the second capacitor 420 extend in a direction intersecting the wiring pattern 110, specifically, in the Y-axis direction corresponding to the width direction of the wiring pattern 110, as described above.

This structure can allow the first interlayer joint 510 and the second interlayer joint 520 to be located closer to the third interlayer joint 530, in comparison to a structure in which the first capacitor 410 and the second capacitor 420 extend in the X-axis direction corresponding to the lengthwise direction of the wiring pattern 110. That is, the structure can make the X-axis path lengths of the first closed circuit and the second closed circuit closer to the X-axis width of the semiconductor device 300.

Furthermore, only the insulating layer 600 illustrated in FIG. 1 is disposed between the first conductive layer 100 and the second conductive layer 200 with respect to the Z-axis direction. No other conductive layer exists between the first conductive layer 100 and the second conductive layer 200. This structure can contribute to contraction of the Z-axis path lengths of the first closed circuit and the second closed circuit.

The structure can therefore narrow each of the area surrounded by a first projected path 810Y viewed in the Y-axis direction, which is depicted by vertically projecting the path of circulation of the first noise current 810 on a virtual XZ plane, and the area surrounded by a second projected path 820Y viewed in the Y-axis direction, which is depicted by virtually projecting the path of circulation of the second noise current 820 on the virtual XZ plane. The structure can thus achieve a lower intensity of radiation noise in the Y-axis direction than an existing structure.

As described above, the structure in the embodiment can suppress generation of radiation noise in each of the X-axis, Y-axis, and Z-axis directions.

In the embodiment, the first capacitor 410 and the second capacitor 420 serve as bypass capacitors for causing the noise current 800 illustrated in FIG. 2 to flow into the ground plane 210.

The ground plane 210 widely distributed in a plane shape can reduce the impedances of the first closed circuit and the second closed circuit against the noise current 800. The structure, in which the first conductive layer 100 and the second conductive layer 200 are adjacent to each other via the insulating layer 600 illustrated in FIG. 1, can shorten the path lengths of the first closed circuit and the second closed circuit, in comparison to a structure in which another conductive layer exists between the first conductive layer 100 and the second conductive layer 200. This structure can also contribute to reduce the impedances of the first closed circuit and the second closed circuit against the noise current 800.

The structure can therefore cause most of the noise current 800 illustrated in FIG. 2 to flow into the ground plane 210, while preventing the noise current 800 from flowing to the power supply circuit or other devices (not illustrated) which can be connected to the wiring pattern 110.

In addition, the first capacitor 410 and the second capacitor 420 feed electric charges to the semiconductor device 300 and can thereby stabilize the operation of the semiconductor device 300.

Embodiment 2

FIG. 2 illustrates an exemplary structure in which the ground terminal 310 and the power supply terminal 320 are aligned in a direction parallel to one side of the rectangular body of the semiconductor device 300 in the plan view. This direction of alignment of the ground terminal 310 and the power supply terminal 320 is a mere example. The following description is directed to a specific example in which the position of the power supply terminal 320 is shifted.

Figure 5:
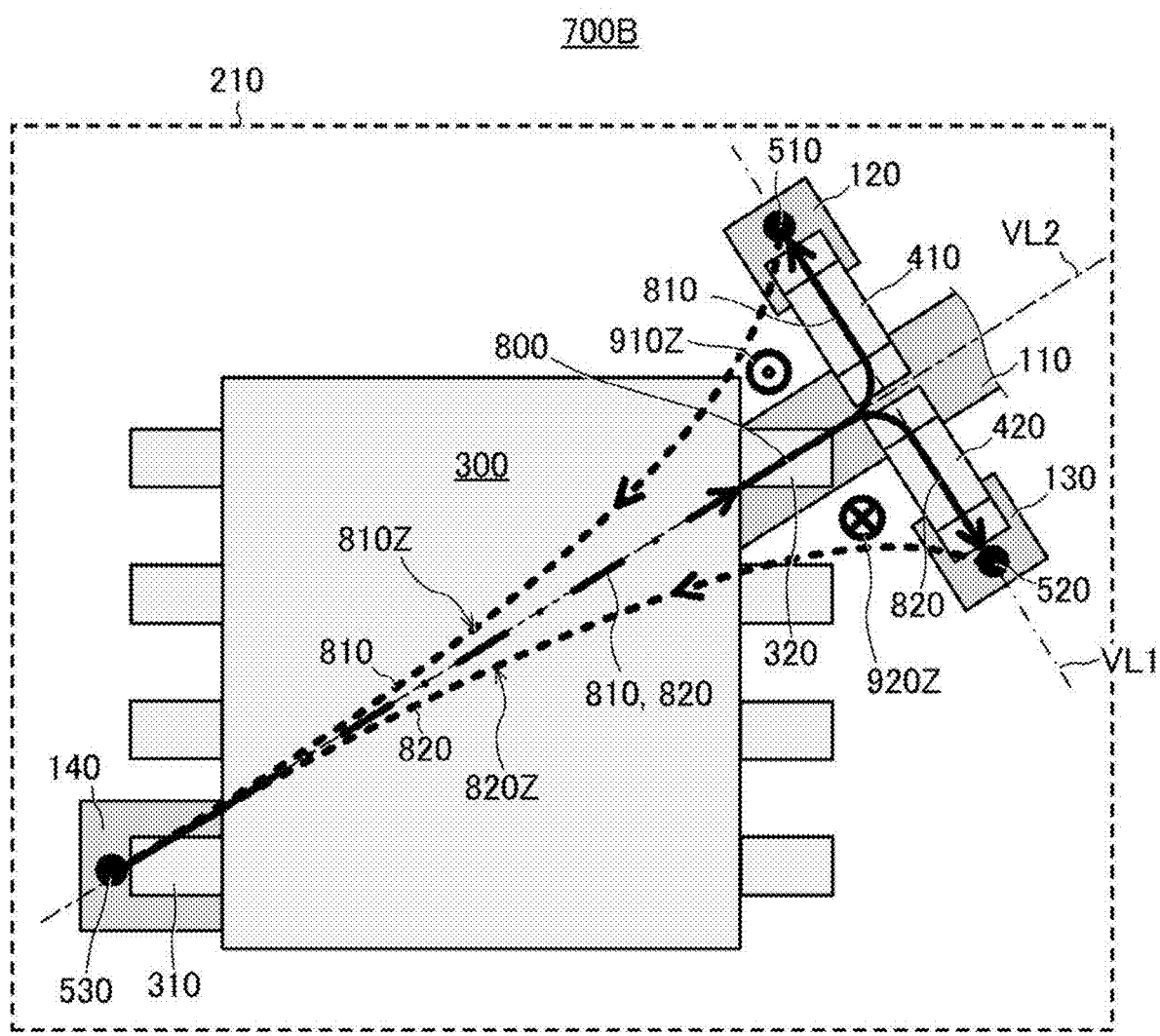
FIG. 5 is a plan view of a major portion of a circuit board according to Embodiment 2.

As illustrated in FIG. 5, in a circuit board 700B according to the embodiment, the ground terminal 310 and the power supply terminal 320 are aligned in a direction intersecting one side of the body of the semiconductor device 300 in the plan view. Although the ground terminal 310 and the power supply terminal 320 are exactly opposed to each other on both sides of the body of the semiconductor device 300 in Embodiment 1, the ground terminal 310 and the power supply terminal 320 in the embodiment are diagonally opposed on both sides of the body of the semiconductor device 300. The wiring pattern 110 extends in a diagonal direction intersecting the direction, in which the power supply terminal 320 extends from the body of the semiconductor device 300, in the plan view.

The embodiment is identical to Embodiment 1 in that the wiring pattern 110 extends in the direction of alignment of the power supply terminal 320 and the ground terminal 310, and that the first capacitor 410 and the second capacitor 420 are aligned in the first virtual straight line VL1 orthogonal to the wiring pattern 110.

The embodiment is identical to Embodiment 1 also in that the first capacitor 410, the first interlayer joint 510, and the first pad 120 are disposed symmetrically to the second capacitor 420, the second interlayer joint 520, and the second pad 130 in the plan view, about the second virtual straight line VL2 extending in the lengthwise direction of the wiring pattern 110.

FIG. 5 is provided with a right-handed XYZ orthogonal coordinate system, in which the Z axis is parallel to the thickness direction of the circuit board 700B, and the positive X-axis direction corresponds to the direction parallel to the lengthwise direction of the wiring pattern 110 and away from the power supply terminal 320 in the plan view. The X-axis direction corresponds to the direction of alignment of the third interlayer joint 530 and the power supply terminal 320 in the plan view, as in Embodiment 1.

In the embodiment, the first capacitor 410 and the second capacitor 420 extend in the Y-axis direction orthogonal to the wiring pattern 110, as in Embodiment 1. This structure can eliminate generation of radiation noise in the Z-axis and X-axis directions, and reduce the radiation noise in the Y-axis direction. The other configurations and effects are identical to those in Embodiment 1.

Embodiment 3

FIGS. 2 and 5 illustrate exemplary structures in which the wiring pattern 110 extends in the direction of alignment the ground terminal 310 and the power supply terminal 320 in the plan view. The ground terminal 310 and the power supply terminal 320, however, are not necessarily aligned in the lengthwise direction of the wiring pattern 110. The following description of the embodiment is directed to a specific example.

Figure 6:
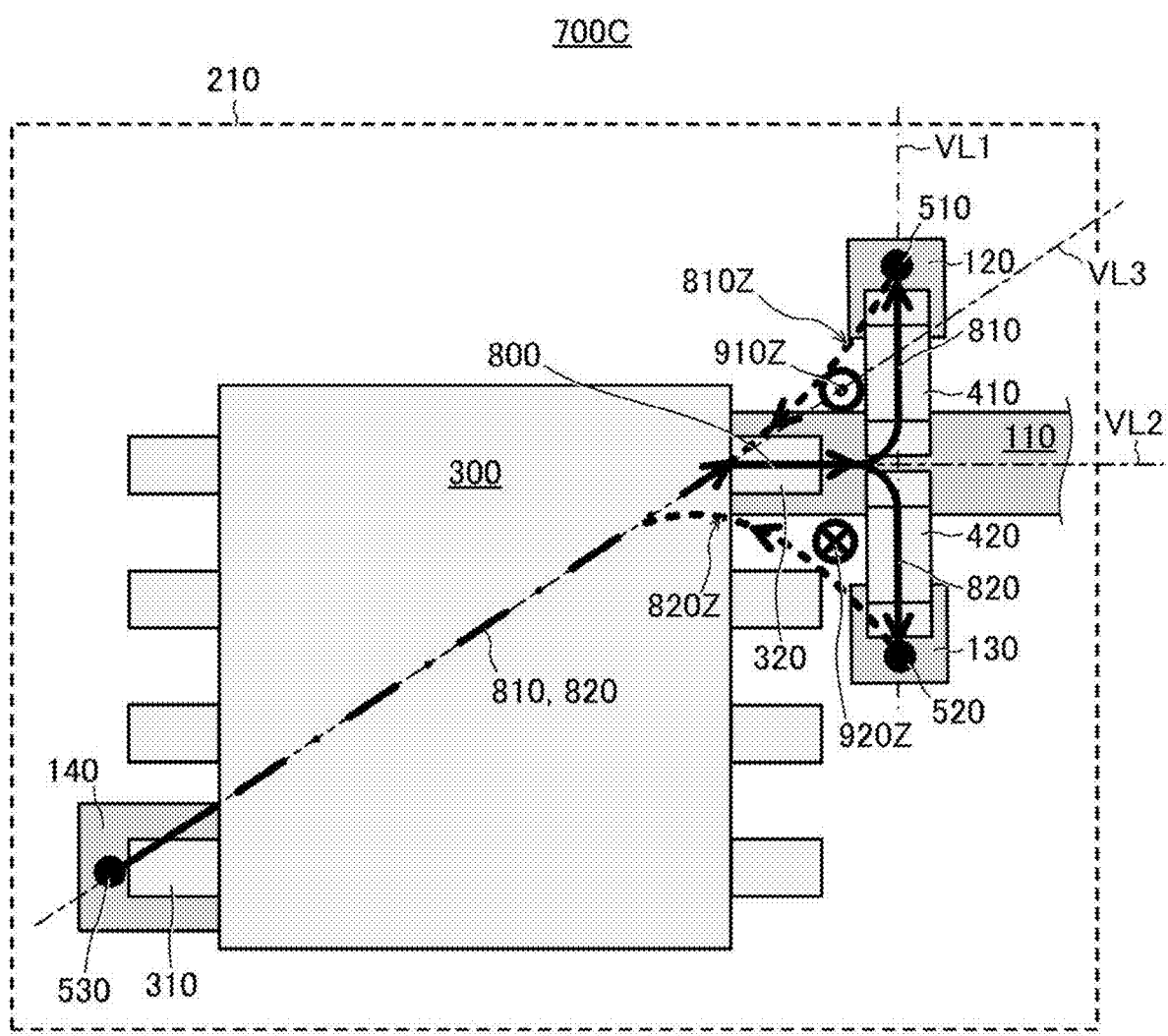
FIG. 6 is a plan view of a major portion of a circuit board according to Embodiment 3.

As illustrated in FIG. 6, in a circuit board 700C according to the embodiment, a third virtual straight line VL3 passing through the third interlayer joint 530, the ground terminal 310, and the power supply terminal 320 intersects the second virtual straight line VL2 extending in the lengthwise direction of the wiring pattern 110, in the plan view. That is, the ground terminal 310 and the power supply terminal 320 are diagonally opposed on both sides of the body of the semiconductor device 300 in the embodiment. The wiring pattern 110 extends in the direction, in which the power supply terminal 320 extends from the body of the semiconductor device 300, in the plan view.

FIG. 6 is provided with a right-handed XYZ orthogonal coordinate system, in which the Z axis is parallel to the thickness direction of the circuit board 700C, and the positive X-axis direction corresponds to the direction parallel to the lengthwise direction of the wiring pattern 110 and away from the power supply terminal 320 in the plan view.

The path of the first noise current 810 and the path of the second noise current 820 have mutually opposite circulations in the plan view in the embodiment, as in Embodiment 1.

In the embodiment, the area surrounded by the first projected path 810Z viewed in the Z-axis direction is smaller than the area surrounded by the second projected path 820Z viewed in the Z-axis direction. Accordingly, the Z-axis component 910Z of the first induced magnetic field and the Z-axis component 920Z of the second induced magnetic field fail to completely offset each other.

The Z-axis component 910Z of the first induced magnetic field, however, has the opposite direction from that of the Z-axis component 920Z of the second induced magnetic field, so that the Z-axis component 910Z of the first induced magnetic field diminishes the Z-axis component 920Z of the second induced magnetic field. The structure can thus reduce generation of radiation noise in the Z-axis direction.

The path of the first noise current 810 and the path of the second noise current 820 have mutually opposite circulations also when viewed in the third virtual straight line VL3 in which the third interlayer joint 530 and the power supply terminal 320 are aligned, although this view is not illustrated.

The second induced magnetic field can also diminish the first induced magnetic field in the direction along the third virtual straight line VL3. This structure can also reduce generation of radiation noise in the direction along the third virtual straight line VL3.

The first capacitor 410 and the second capacitor 420 extend in the Y-axis direction corresponding to the width direction of the wiring pattern 110. This structure can make the X-axis path lengths of the first closed circuit and the second closed circuit closer to the X-axis width of the semiconductor device 300, as in Embodiment 1. The structure can thus achieve a lower intensity of radiation noise in the Y-axis direction than an existing structure. The other configurations and effects are identical to those in Embodiment 1.

Embodiment 4

A sufficient reduction in the radiation noise in the Z-axis direction can eliminate the need for a shielding member for electrostatically blocking radiation noise to be disposed in the Z-axis direction of the circuit board 700C. Particularly required is a sufficient reduction in the radiation noise in the Z-axis direction.

In the above-described Embodiment 3, the impedance of the first closed circuit may be adjusted to be lower than the impedance of the second closed circuit, in order to further reduce the radiation noise in the Z-axis direction. The following description of the embodiment is directed to a specific example.

Figure 7:
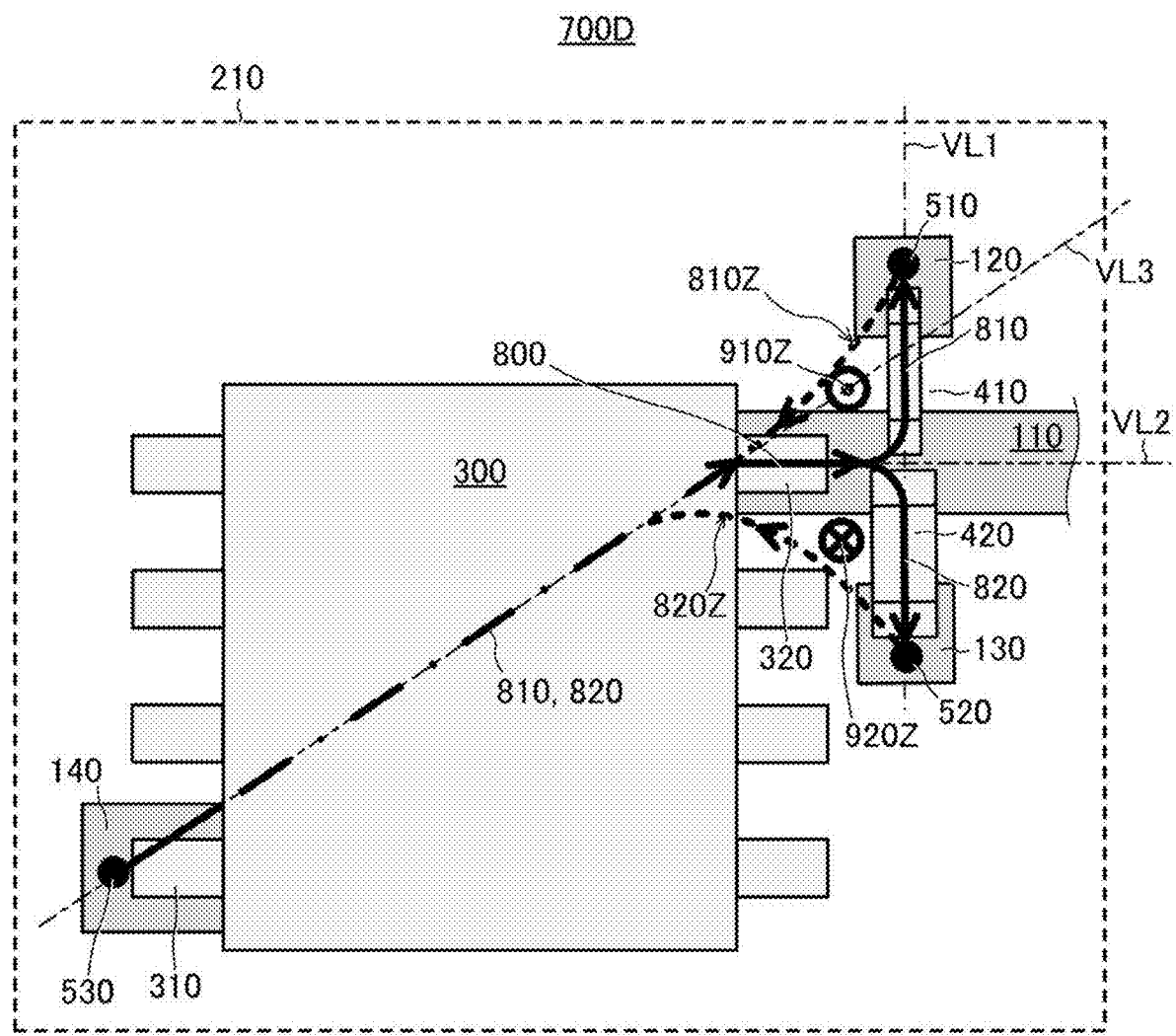
FIG. 7 is a plan view of a major portion of a circuit board according to Embodiment 4.

As illustrated in FIG. 7, in a circuit board 700D according to the embodiment, the pair of electrode plates of the first capacitor 410 have a smaller size than the pair of electrode plates of the second capacitor 420. That is, the first capacitor 410 is designed to have an equivalent series inductance (ESL) lower than the ESL of the second capacitor 420. The other configurations are identical to those in the above-described Embodiment 3.

The above-described structure can adjust the impedance of the first capacitor 410 against the noise current 800 to be lower than the impedance of the second capacitor 420 against the noise current 800, with respect to the frequency range of the target noise current. Accordingly, the impedance of the first closed circuit against the noise current 800 is lower than the impedance of the second closed circuit against the noise current 800.

The first noise current 810 thus has a magnitude, specifically, an effective value higher than the effective value of the second noise current 820. This configuration can make the magnitude of the Z-axis component 910Z of the first induced magnetic field closer to the magnitude of the Z-axis component 920Z of the second induced magnetic field, despite of the area surrounded by the first projected path 810Z viewed in the Z-axis direction smaller than the area surrounded by the second projected path 820Z viewed in the Z-axis direction.

The Z-axis component 920Z of the second induced magnetic field can therefore be mostly diminished by the Z-axis component 910Z of the first induced magnetic field, leading to a further reduction in the radiation noise in the Z-axis direction. The other configurations and effects are identical to those in Embodiment 3.

In the above-described specific example, the impedance of the first capacitor 410 is adjusted to be lower than the impedance of the second capacitor 420 by designing the first capacitor 410 to have a size smaller than the second capacitor 420. Alternatively, with respect to some frequency ranges of the noise current, the first capacitor 410 may be designed to have a size larger than the second capacitor 420. This structure can adjust the impedance of the first capacitor 410 against the noise current 800 to be lower than the impedance of the second capacitor 420 against the noise current 800. Alternatively, the impedances of the first capacitor 410 and the second capacitor 420 may be adjusted without changing the sizes of the capacitors. For example, the impedances may be adjusted by changing the distance between the electrode plates included in a capacitor or substituting the dielectric material between the electrode plates.

In the above-described specific example, the impedance of the first capacitor 410 against the noise current 800 is adjusted to be lower than the impedance of the second capacitor 420 against the noise current 800 by designing the first capacitor 410 to have an ESL lower than the ESL of the second capacitor 420. In the embodiment, however, only required is to adjust the impedance of the first closed circuit against the noise current 800 to be lower than the impedance of the second closed circuit against the noise current 800 for the purpose of reduction in the radiation noise in the Z-axis direction. That is, the impedances of the first closed circuit and the second closed circuit may also be adjusted by controlling the equivalent series resistances (ESRs) and capacitances of the applied first capacitor 410 and second capacitor 420 in view of their frequency characteristics.

That is, in the embodiment, the impedance of the first closed circuit against the noise current 800 is adjusted to be lower than the impedance of the second closed circuit against the noise current 800 by controlling the capacitive reactance constituting the imaginary part of the impedance, so that the radiation noise in the Z-axis direction is reduced.

Embodiment 5

In the above-described Embodiment 4, the impedance of the first closed circuit is adjusted to be lower than the impedance of the second closed circuit by controlling the capacitive reactance constituting the imaginary part of the impedance. Alternatively, the impedance of the first closed circuit may be adjusted to be lower than the impedance of the second closed circuit by controlling the resistance component constituting the real part of the impedance. The following description of the embodiment is directed to a specific example.

Figure 8:
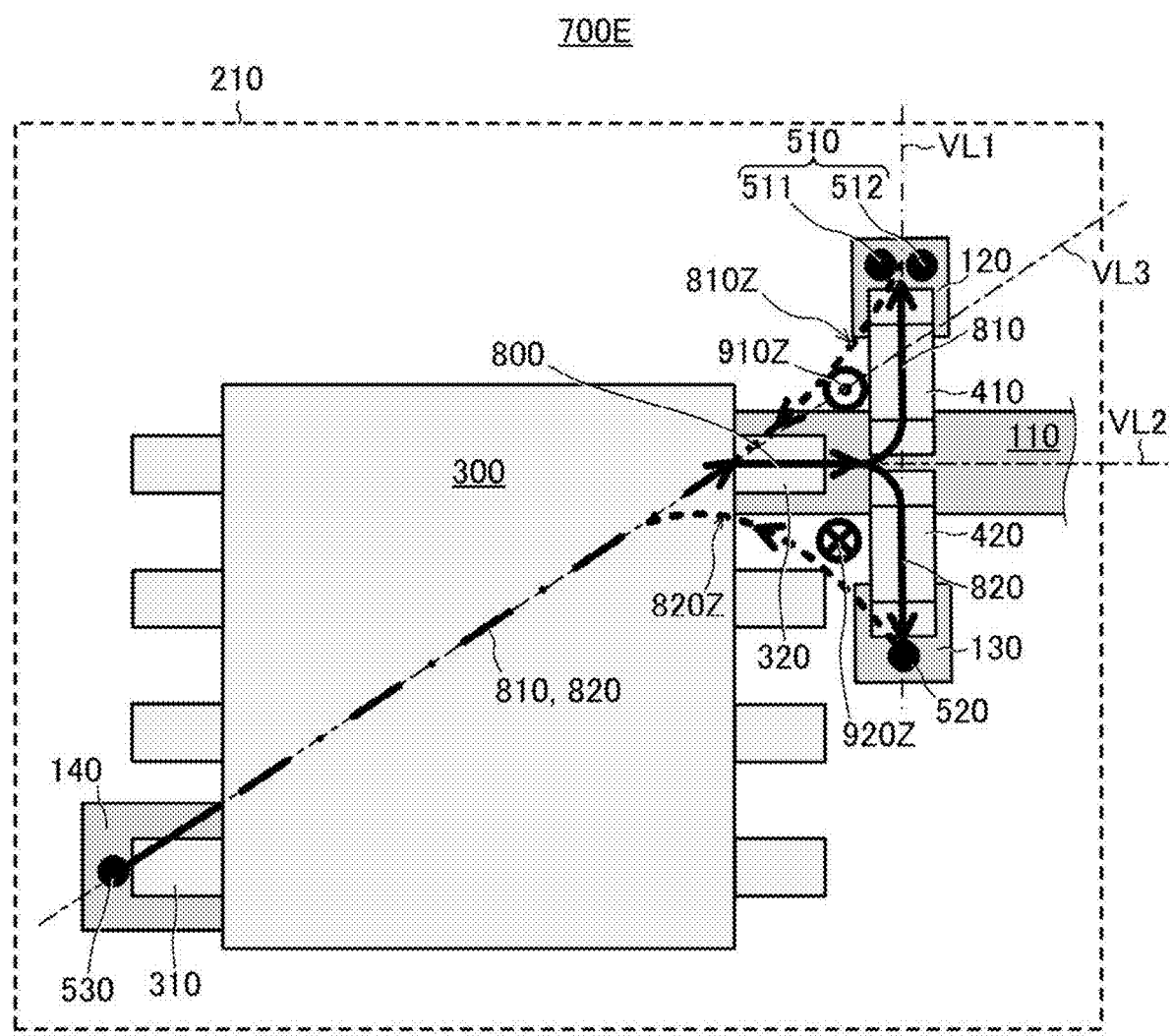
FIG. 8 is a plan view of a major portion of a circuit board according to Embodiment 5.
Figure 8:
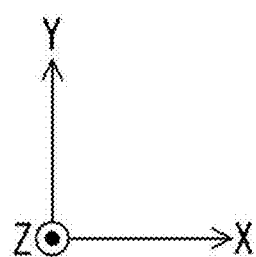

As illustrated in FIG. 8, in a circuit board 700E according to the embodiment, the first interlayer joint 510 includes two interlayer joints 511 and 512 arranged in parallel to each other. The first interlayer joint 510 thus has a resistance lower than the resistance of the second interlayer joint 520. Accordingly, the impedance of the first closed circuit against the noise current 800 is lower than the impedance of the second closed circuit against the noise current 800. The other configurations are identical to those in the above-described Embodiments 3 and 4.

The Z-axis component 920Z of the second induced magnetic field can therefore be mostly diminished by the Z-axis component 910Z of the first induced magnetic field for the same reason as in Embodiment 4, leading to a further reduction in the radiation noise in the Z-axis direction. The other configurations and effects are identical to those in Embodiment 3.

In the above specific example in the embodiment, the structure in which the first interlayer joint 510 includes the interlayer joints 511 and 512 can adjust the resistance of the first interlayer joint 510 to be lower than the resistance of the second interlayer joint 520. In the embodiment, however, only required is to adjust the impedance of the first closed circuit to be lower than the impedance of the second closed circuit by controlling the resistance component constituting the real part of the impedance. That is, the impedance of the first pad 120 may also be adjusted to be lower than the impedance of the second pad 130 by varying the shapes, lengths, and widths of the first pad 120 and the second pad 130. These procedures can also achieve the feature that the impedance of the first closed circuit against the noise current 800 is lower than the impedance of the second closed circuit against the noise current 800.

Embodiment 6

In the above-described Embodiments 4 and 5, the magnitude of the Z-axis component 910Z of the first induced magnetic field is made closer to the magnitude of the Z-axis component 920Z of the second induced magnetic field, by adjusting the ratio between the effective value of the first noise current 810 and the effective value of the second noise current 820.

Alternatively, the magnitude of the Z-axis component 910Z of the first induced magnetic field may be made closer to the magnitude of the Z-axis component 920Z of the second induced magnetic field, by adjusting the ratio between the area surrounded by the first projected path 810Z viewed in the Z-axis direction and the area surrounded by the second projected path 820Z viewed in the Z-axis direction. The following description of the embodiment is directed to a specific example.

Figure 9:
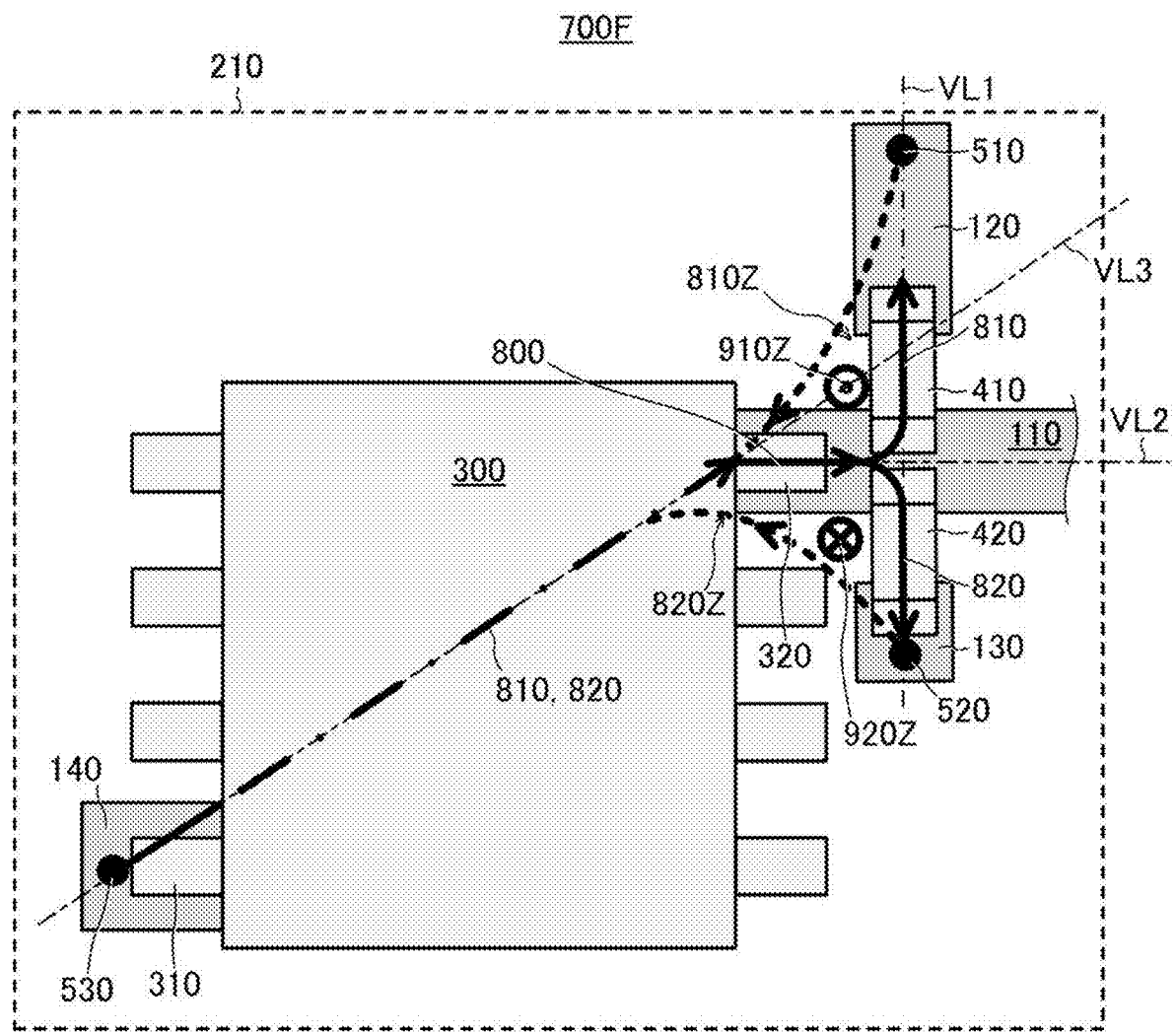
FIG. 9 is a plan view of a major portion of a circuit board according to Embodiment 6.

As illustrated in FIG. 9, in a circuit board 700F according to the embodiment, the first capacitor 410 and the first interlayer joint 510 are disposed asymmetrically to the second capacitor 420 and the second interlayer joint 520, about the second virtual straight line VL2.

Specifically, the first pad 120 has a Y-axis length longer than the Y-axis length of the second pad 130. That is, the first pad 120 extends from one end connected to the first capacitor 410 in the direction of extension of the first capacitor 410 in the plan view. The Y-axis distance from the one terminal of the first capacitor 410 to the first interlayer joint 510 is therefore longer than the Y-axis distance from the one terminal of the second capacitor 420 to the second interlayer joint 520.

This structure can make the area surrounded by the first projected path 810Z viewed in the Z-axis direction closer to the area surrounded by the second projected path 820Z viewed in the Z-axis direction. The structure can accordingly make the magnitude of the Z-axis component 910Z of the first induced magnetic field closer to the magnitude of the Z-axis component 920Z of the second induced magnetic field.

The Z-axis component 920Z of the second induced magnetic field can therefore be mostly diminished by the Z-axis component 910Z of the first induced magnetic field, leading to a further reduction in the radiation noise in the Z-axis direction. The other configurations and effects are identical to those in Embodiment 3.

In the above-described specific example in the embodiment, the first capacitor 410 and the first interlayer joint 510 are disposed asymmetrically to the second capacitor 420 and the second interlayer joint 520 about the second virtual straight line VL2, by designing the first pad 120 to have a Y-axis length longer than the Y-axis length of the second pad 130. Other configurations are also available, provided that the magnitude of the Z-axis component 910Z of the first induced magnetic field can be made closer to the magnitude of the Z-axis component 920Z of the second induced magnetic field, by adjusting the ratio between the area surrounded by the first projected path 810Z viewed in the Z-axis direction and the area surrounded by the second projected path 820Z viewed in the Z-axis direction.

For a specific example, the first capacitor 410 in FIG. 9 may be displaced in the positive Y-axis direction while maintaining the electrical connection of the one terminal to the wiring pattern 110 and the electrical connection of the other terminal to the first pad 120, and the second capacitor 420 may be displaced in the positive Y-axis direction while maintaining the electrical connection of the one terminal to the wiring pattern 110 and the electrical connection of the other terminal to the second pad 130. This displacement can dispose the first capacitor 410 asymmetrically to the second capacitor 420 about the second virtual straight line VL2, and thus adjust the ratio between the area surrounded by the first projected path 810Z viewed in the Z-axis direction and the area surrounded by the second projected path 820Z viewed in the Z-axis direction. This structure can make the magnitude of the Z-axis component 910Z of the first induced magnetic field closer to the magnitude of the Z-axis component 920Z of the second induced magnetic field.

Alternatively, the magnitude of the Z-axis component 910Z of the first induced magnetic field may be made closer to the magnitude of the Z-axis component 920Z of the second induced magnetic field, by diagonally orienting one or both of the first capacitor 410 and the second capacitor 420 in a rotational direction relative to the first virtual straight line VL1 to dispose the first capacitor 410 asymmetrically to the second capacitor 420 about the second virtual straight line VL2, and thus adjusting the ratio between the area surrounded by the first projected path 810Z viewed in the Z-axis direction and the area surrounded by the second projected path 820Z viewed in the Z-axis direction.

Embodiment 7

In the above-described Embodiments 1 to 6, one or more other capacitors may be connected in parallel to the first capacitor 410, and one or more other capacitors may be connected in parallel to the second capacitor 420. The following description of the embodiment is directed to a specific example.

Figure 10:
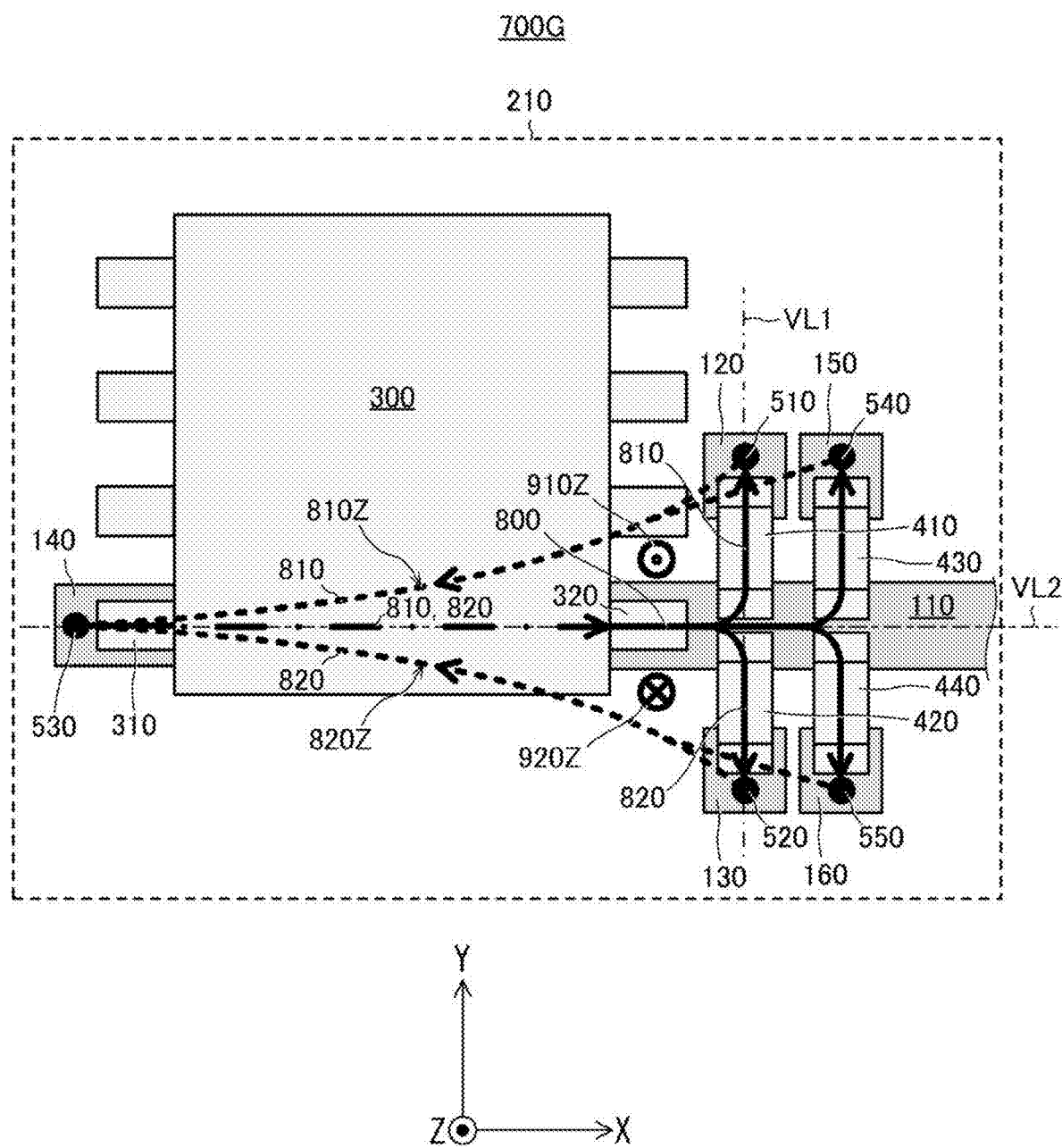
FIG. 10 is a plan view of a major portion of a circuit board according to Embodiment 7.

As illustrated in FIG. 10, a circuit board 700G according to the embodiment further includes a third capacitor 430 connected in parallel to the first capacitor 410, and a fourth capacitor 440 connected in parallel to the second capacitor 420.

The third capacitor 430 extends from the wiring pattern 110 in the positive Y-axis direction, like the first capacitor 410. The third capacitor 430 has one terminal connected to the wiring pattern 110, and the other terminal connected to a third pad 150. The third pad 150 is connected to the ground plane 210 via a fourth interlayer joint 540.

The fourth capacitor 440 extends from the wiring pattern 110 in the negative Y-axis direction, like the second capacitor 420. The fourth capacitor 440 has one terminal connected to the wiring pattern 110, and the other terminal connected to a fourth pad 160. The fourth pad 160 is connected to the ground plane 210 via a fifth interlayer joint 550.

The third capacitor 430, the fourth interlayer joint 540, and the third pad 150 are disposed symmetrically to the fourth capacitor 440, the fifth interlayer joint 550, and the fourth pad 160 in the plan view, about the second virtual straight line VL2.

The unit including the first capacitor 410 and the third capacitor 430 has an equivalent series resistance (ESR) and an equivalent series inductance (ESL) lower than the ESR and the ESL of each of the first capacitor 410 and the third capacitor 430. This configuration can further reduce the impedance of the first closed circuit against the noise current 800.

The unit including the second capacitor 420 and the fourth capacitor 440 has an ESR and an ESL lower than the ESR and the ESL of each of the second capacitor 420 and the fourth capacitor 440. This configuration can further reduce the impedance of the second closed circuit against the noise current 800.

The above-described further reductions in the impedances of the first closed circuit and the second closed circuit can enhance the effects of trapping the noise current 800 inside the first closed circuit and the second closed circuit.

The first capacitor 410 and the third capacitor 430 are preferably selected such that fa is not equal to fb, where fa indicates the frequency that provides the minimum impedance of the first capacitor 410, and fb indicates the frequency that provides the minimum impedance of the third capacitor 430. This configuration can extend the range of frequency that provides a low impedance of the first closed circuit.

Also, the second capacitor 420 and the fourth capacitor 440 are preferably selected such that fc is not equal to fd, where fc indicates the frequency that provides the minimum impedance of the second capacitor 420, and fd indicates the frequency that provides the minimum impedance of the fourth capacitor 440. This configuration can extend the range of frequency that provides a low impedance of the second closed circuit.

The above-described extension of the ranges of frequency that provide low impedances of the first closed circuit and the second closed circuit can achieve trapping of the noise current 800 containing various frequency components inside the first closed circuit and the second closed circuit.

The above-described Embodiments 1 to 7 may be modified as is described below, for example.

Although FIG. 2 illustrates an exemplary structure in which the first capacitor 410, the first interlayer joint 510, the first pad 120, the second capacitor 420, the second interlayer joint 520, and the second pad 130 are aligned in the first virtual straight line VL1 in the plan view, these components are not necessarily aligned in the same straight line.

FIG. 2 illustrates an exemplary structure in which the direction of extension of the first capacitor 410 and the second capacitor 420 matches the width direction of the wiring pattern 110. The first capacitor 410 is only required to extend from the wiring pattern 110 to a region located on one side of the wiring pattern 110 in the width direction, and the direction of extension of the first capacitor 410 may be deviated from the width direction of the wiring pattern 110. In addition, the second capacitor 420 is only required to extend from the wiring pattern 110 to a region located on the other side of the wiring pattern 110 in the width direction, and the direction of extension of the second capacitor 420 may be deviated from the width direction of the wiring pattern 110.

FIG. 7 illustrates an example in which the impedance of the first closed circuit is adjusted to be lower than the impedance of the second closed circuit, by means of the ratio of the electrostatic capacities between the first capacitor 410 and the second capacitor 420. FIG. 8 illustrates an example in which the impedance of the first closed circuit is adjusted to be lower than the impedance of the second closed circuit, by means of the ratio of the resistances between the first interlayer joint 510 and the second interlayer joint 520. Alternatively, the impedance of the first closed circuit may be adjusted to be lower than the impedance of the second closed circuit, by means of the ratio of the impedance of a component of the first closed circuit, other than the first capacitor 410 and the first interlayer joint 510, and the impedance of a component of the second closed circuit, other than the second capacitor 420 and the second interlayer joint 520.

FIG. 9 illustrates an example in which the area surrounded by the first projected path 810Z viewed in the Z-axis direction is made closer to the area surrounded by the second projected path 820Z viewed in the Z-axis direction, by means of the ratio between the Y-axis length of the first pad 120 and the Y-axis length of the second pad 130. Alternatively, the area surrounded by the first projected path 810Z viewed in the Z-axis direction may be made closer to the area surrounded by the second projected path 820Z viewed in the Z-axis direction, by means of the ratio between the length of a member of the first closed circuit, other than the first pad 120, and the length of a member of the second closed circuit, other than the second pad 130.

The semiconductor device 300 illustrated in FIG. 2 may be any device, provided that the semiconductor device 300 includes a reference terminal to provide a reference potential and a non-reference terminal to output signals. Examples of the semiconductor device 300 include application specific integrated circuits (ASICs), field programmable gate arrays (FPGAs), other integrated circuits (ICs), and field effect transistors (FETs). The semiconductor device 300 may include an oscillator circuit or other active circuit therein. The semiconductor device 300 may include a package, such as small outline package (SOP), quad flat package (QFP), small outline transistor (SOT) package, quad flat no-lead (QFN) package, or ball grid array (BGA) package, for example.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

100 First conductive layer
110 Wiring pattern (wiring member)
120 First pad
130 Second pad
140 Ground pad
150 Third pad
160 Fourth pad
200 Second conductive layer
210 Ground plane (reference member)
300 Semiconductor device
310 Ground terminal (reference terminal)
320 Power supply terminal (non-reference terminal)
410 First capacitor
420 Second capacitor
430 Third capacitor
440 Fourth capacitor
510 First interlayer joint
511, 512 Interlayer joint
520 Second interlayer joint
530 Third interlayer joint
540 Fourth interlayer joint
550 Fifth interlayer joint
600 Insulating layer
700A, 700B, 700C, 700D, 700E, 700F, 700G Circuit board
800 Noise current (high-frequency current)
810 First noise current
810X First projected path viewed in the X-axis direction
810Y First projected path viewed in the Y-axis direction
810Z First projected path viewed in the Z-axis direction (first projected path)
820 Second noise current
820X Second projected path viewed in the X-axis direction
820Y Second projected path viewed in the Y-axis direction
820Z Second projected path viewed in the Z-axis direction (second projected path)
910X X-axis component of the first induced magnetic field
910Y Y-axis component of the first induced magnetic field
910Z Z axis component of the first induced magnetic field
920X X-axis component of the second induced magnetic field
920Y Y-axis component of the second induced magnetic field
920Z Z axis component of the second induced magnetic field
VL1 First virtual straight line
VL2 Second virtual straight line
VL3 Third virtual straight line

The invention claimed is:

1. A circuit board comprising a stack of a first conductive layer and a second conductive layer each having electrical conductivity provided with an insulating layer having an electrical insulating property therebetween, the circuit board being provided with a semiconductor device thereon, the semiconductor device comprising a reference terminal to provide a reference potential and a non-reference terminal to output a signal, the circuit board comprising:
a wiring member included in the first conductive layer;
a first capacitor and a second capacitor, each of the capacitors comprising one terminal connected to the wiring member;
a reference member included in the second conductive layer;
a first interlayer joint to electrically connect the reference member to another terminal of the first capacitor;
a second interlayer joint to electrically connect the reference member to another terminal of the second capacitor; and
a third interlayer joint to electrically connect the reference member to the reference terminal, with the semiconductor device mounted on the circuit board, wherein
the first capacitor extends from the wiring member to a region located on one side of the wiring member in a width direction thereof, and the second capacitor extends from the wiring member to a region located on another side of the wiring member in the width direction, and
with the semiconductor device mounted on the circuit board,
the non-reference terminal is electrically connected to the wiring member,
the semiconductor device, the wiring member, the first capacitor, the first interlayer joint, the reference member, and the third interlayer joint constitute a first closed circuit, and
the semiconductor device, the wiring member, the second capacitor, the second interlayer joint, the reference member, and the third interlayer joint constitute a second closed circuit.

2. The circuit board according to claim 1, wherein the first capacitor and the second capacitor extend from the wiring member in mutually opposite directions, such that the respective one terminals of the capacitors face each other in a first virtual straight line in a plan view of the first conductive layer, the first virtual straight line intersecting the wiring member.

3. The circuit board according to claim 2, wherein the first capacitor and the first interlayer joint are disposed symmetrically to the second capacitor and the second interlayer joint in the plan view about a second virtual straight line, the second virtual straight line extending in a lengthwise direction of the wiring member.

4. The circuit board according to claim 3, wherein the reference terminal and the non-reference terminal are aligned in the second virtual straight line in the plan view.

5. The circuit board according to claim 1, wherein
the semiconductor device is subject to internal generation of high-frequency current having a frequency of 100 kHz or higher,
an area surrounded by a first projected path is smaller than an area surrounded by a second projected path, the first projected path being depicted by vertically projecting a path of the high-frequency current in the first closed circuit on a virtual plane parallel to the first conductive layer, the second projected path being depicted by vertically projecting a path of the high-frequency current in the second closed circuit on the virtual plane, and the first closed circuit has an impedance against the high-frequency current lower than an impedance of the second closed circuit against the high-frequency current.

6. The circuit board according to claim 5, wherein the first capacitor has an equivalent series inductance lower than an equivalent series inductance of the second capacitor.

7. The circuit board according to claim 5, wherein the first interlayer joint has a resistance lower than a resistance of the second interlayer joint.

8. The circuit board according to claim 1, further comprising:
   a third capacitor connected in parallel to the first capacitor; and
   a fourth capacitor connected in parallel to the second capacitor.

9. The circuit board according to claim 1, wherein the reference member is distributed in a plane shape encompassing a triangular region defined by three vertices, the three vertices comprising a connection of the first interlayer joint with the reference member, a connection of the second interlayer joint with the reference member, and a connection of the third interlayer joint with the reference member.

* * * * *